United States Patent
Park et al.

(10) Patent No.: US 7,254,757 B2
(45) Date of Patent: Aug. 7, 2007

(54) FLASH MEMORY TEST SYSTEM AND METHOD CAPABLE OF TEST TIME REDUCTION

(75) Inventors: Dong-Kyoo Park, Gyeonggi-do (KR); Jong-Kook Kim, Chungcheongnam-do (KR); Jeong-Ho Bang, Gyeonggi-do (KR); Sang-Young Choi, Gyeonggi-do (KR); Eun-Sik Kim, Chungcheongnam-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 318 days.

(21) Appl. No.: 10/954,834

(22) Filed: Sep. 29, 2004

(65) Prior Publication Data

US 2005/0102589 A1 May 12, 2005

(30) Foreign Application Priority Data

Nov. 12, 2003 (KR) .................... 10-2003-0079901

(51) Int. Cl.
*G11C 29/00* (2006.01)
*G11C 7/00* (2006.01)
*G01R 31/28* (2006.01)

(52) U.S. Cl. .................. 714/718; 714/738; 365/201
(58) Field of Classification Search ............. 714/710, 714/711, 718, 723, 724; 365/200–201
See application file for complete search history.

(56) References Cited

U.S. PATENT DOCUMENTS

| | | | |
|---|---|---|---|
| 5,896,398 A | 4/1999 | Sekine | |
| 6,061,813 A | 5/2000 | Goishi | |
| 6,073,263 A * | 6/2000 | Arkin et al. | 714/738 |
| 6,314,034 B1 * | 11/2001 | Sugamori | 365/201 |
| 6,476,628 B1 | 11/2002 | LeColst | |
| 6,477,672 B1 * | 11/2002 | Satoh | 714/721 |
| 6,499,121 B1 | 12/2002 | Roy et al. | |
| 6,631,340 B2 * | 10/2003 | Sugamori et al. | 702/122 |
| 6,634,004 B1 * | 10/2003 | Yamada et al. | 714/721 |
| 6,687,855 B1 * | 2/2004 | Krech et al. | 714/30 |
| 6,829,181 B1 * | 12/2004 | Seitoh | 365/201 |
| 6,842,031 B2 * | 1/2005 | Koh et al. | 324/765 |
| 6,940,781 B2 * | 9/2005 | Seitoh | 365/230.06 |

FOREIGN PATENT DOCUMENTS

KR 2003-0031789 4/2003

OTHER PUBLICATIONS

English abstract of Korean Publication No. 2003-0031789.

* cited by examiner

*Primary Examiner*—Cynthia Britt
(74) *Attorney, Agent, or Firm*—Marger Johnson & McCollom, P.C.

(57) ABSTRACT

A flash memory test system capable of test time reduction and an electrical test method using the same: The invention provides a parallel tester that includes a first memory and a second memory. The first and second memories are used to each supply different data to identical addresses within a plurality of DUTs, thereby making it possible to conduct in parallel tests such as trim tests, repair tests, and invalid block masking test. Thus parallel testing is done to replace testing that was previously done serially.

19 Claims, 8 Drawing Sheets

FLASH MEMORY TEST SYSTEM AND METHOD CAPABLE OF TEST TIME REDUCTION

BACKGROUND OF THE INVENTION

This application claims the priority of Korean Patent Application No. 2003-79901, filed on Nov. 12, 2003, in the Korean Intellectual Property Office. The entire disclosure of Korean Patent Application No. 2003-79901 is hereby incorporated herein by reference.

1. Field of the Invention

The present invention relates to devices and methods for electrically testing semiconductor memory devices, and more particularly to methods and devices for electrically testing flash memory devices.

2. Description of the Related Art

Prior to sale, semiconductor devices are tested and screened to determine if defects were produced during the fabricating process. The devices are tested and screened after completing the wafer fabricating process and/or after the package assembly process.

Test systems measure Direct Current (DC), measure Alternating Current (AC), and test the functional characteristics of the semiconductor devices. Testing semiconductor memory devices demands high throughput, i.e., high productivity. Therefore, most makers of semiconductor memory devices use parallel test systems rather than serial test systems.

Serial test systems perform tests on a one by one basis. Parallel testing simultaneously tests many devices at the same time, thus, enhancing the throughput. In many of the presently available testers, the number of Devices Under Test (DUT) that can be simultaneously tested in parallel is 256.

FIG. 1 is a block diagram schematically showing a conventional tester used to an electrically test semiconductor memory devices.

The tester 90 includes a test processor 10. A programmable power supply 20 is connected to and controlled by the test processor 10. A DC parameter measurement unit 30 and an algorithmic pattern generator 40 are also connected to and controlled by the test processor 10. The algorithmic pattern generator 40 has a first memory 42 for storing failure information. A timing generator 50 and pin electronics 70 are also connected to and controlled by the test processor 10. Pin electronics 70 includes a driver 72 and a comparator 74. A wave shape formatter 60 processes information supplied from the algorithmic pattern generator 40 and the timing generator 50 to supply the processed information to the pin electronics 70. The reference numeral 80 designates one or more DUTs.

FIG. 2 is a block diagram showing how the memories of the DUTs are mapped to the first memory 42 while flash memory devices are subjected to the electrical test. Referring to FIG. 2, the system operates as follows. The tester 90 starts to sequentially test the DC, AC and function characteristics of the DUTs 80 so as to electrically test the flash memory device. The system illustrated is a parallel test system, in which a plurality of DUTs 80a, 80b, 80c, 80d, ..., and 80n are simultaneously tested.

The memory 42 is generally referred to as a Failure Analysis Memory (FAM) or an Error Catch RAM (ECR). It stores failure information when failures occurs during the function test. The memory 42 is constructed to correspond to a memory map of respective DUTs 80a, 80b, 80c, 80d, ..., and 80n. Thus, if the failure occurs in the 100th address in the memory of the first DUT 80a, failure information is stored in the 100th address of memory 42, which is associated with the first DUT 80a in the tester.

The information stored in the memory 42 is used as expected data when a write operation or a read operation is simultaneously executed in the plurality of DUTs 80a, 80b, 80c, 80d, ..., and 80n.

Since conventional semiconductor memory testers have only a single memory 42, and this memory stores the failure information generated in the DUTs 80a, 80b, 80c, 80d, ..., and 80n, only the same data can be transferred to the plurality of DUTs 80a, 80b, 80c, 80d, ..., and 80n. Thus, tests such as a trim test, a repair test, and an invalid block masking test can not be performed on such a tester. Such tests must be individually performed with respect to each of the DUTs 80a, 80b, 80c, 80d, ..., and 80n since they have different failure addresses. With conventional testers, such tests must, in general, be performed by a serial test system.

An example of a system that conducts electrical tests of semiconductor memory devices and which has only a single memory is shown in U.S. Pat. No. 5,896,398 (issued in Apr. 20, 1999).

FIG. 3 is a block diagram illustrating a prior art method of electrically testing flash memory devices. FIG. 4 is a flowchart illustrating a method of electrically testing the flash memory device according to conventional techniques.

Referring to FIGS. 3 and 4, electrical tests of the flash memory devices are conducted by a parallel test system. The test generally includes a pin contact test (SI 0 in FIG. 4), a DC characteristic test (S20), a function test & an AC characteristic test (S30) and pass/reject sorting (S40). All tests are executed by the parallel test system and they have a relatively high throughput when the number of DUTs is in the order of 256 devices. However, in order to conduct tests such as an invalid block masking test, the electrical test is conducted serially. Such a test involves searching for failure information in the memory 42 on a one by one basis (see FIG. 3) without carrying out the parallel test. Consequently, the electrical test is shifted from a parallel system to a serial system. This extends the test time and degrades test efficiency.

SUMMARY OF THE INVENTION

The present invention provides a flash memory tester which tests, in parallel, items that are serially tested by prior art testers. The tester of the present invention can therefore shorten test time.

With the present invention there is a first memory and a second memory associated with an algorithmic pattern generator in a tester. First, a test program is loaded into the tester and executed to test a plurality of DUTs in parallel. Once a failure is found in the DUT during a function test, the failure information is stored in a corresponding address of the first memory. Later the failure information of the first memory is searched and information with respect to the failure address is stored in the second memory. Finally, a parallel test is conducted during which different data is supplied to identical addresses of a plurality of DUTs using the data stored in the first and second memories.

According to an embodiment of the present invention, the trim test, the repair test and the invalid block masking test are conducted in parallel thereby reducing the test time and enhancing efficiency of the electrical test process.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings, in which exemplary embodiments of the invention are shown. The invention may, however, be embodied in many different forms and should not be construed as being limited to the embodiments set forth herein. These embodiments are provided so that this disclosure will convey the concept of the invention to those skilled in the art.

Figure 1:
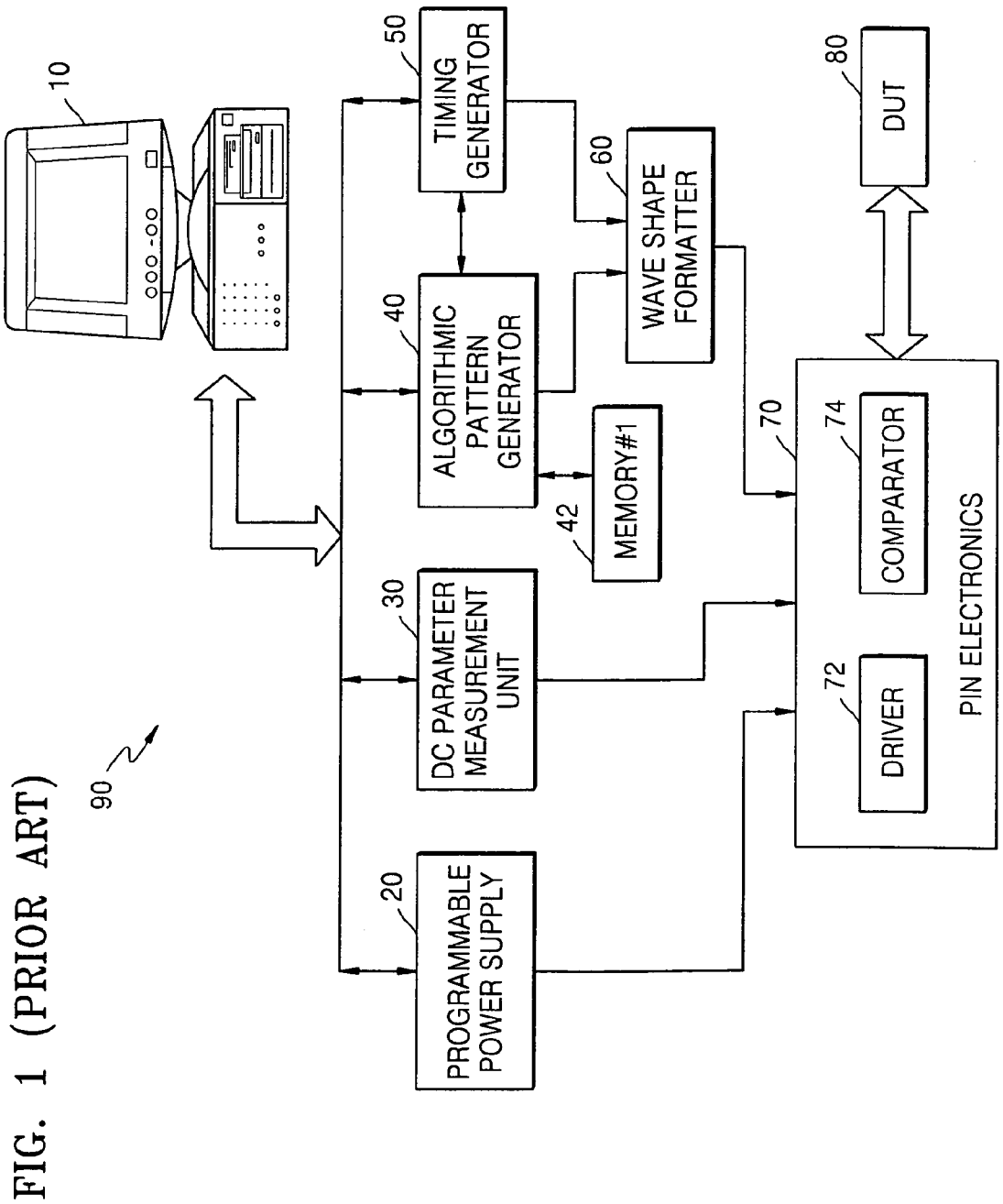
FIG. 1 is a schematic block diagram showing a conventional tester used to electrically test a semiconductor memory device.
Figure 2:
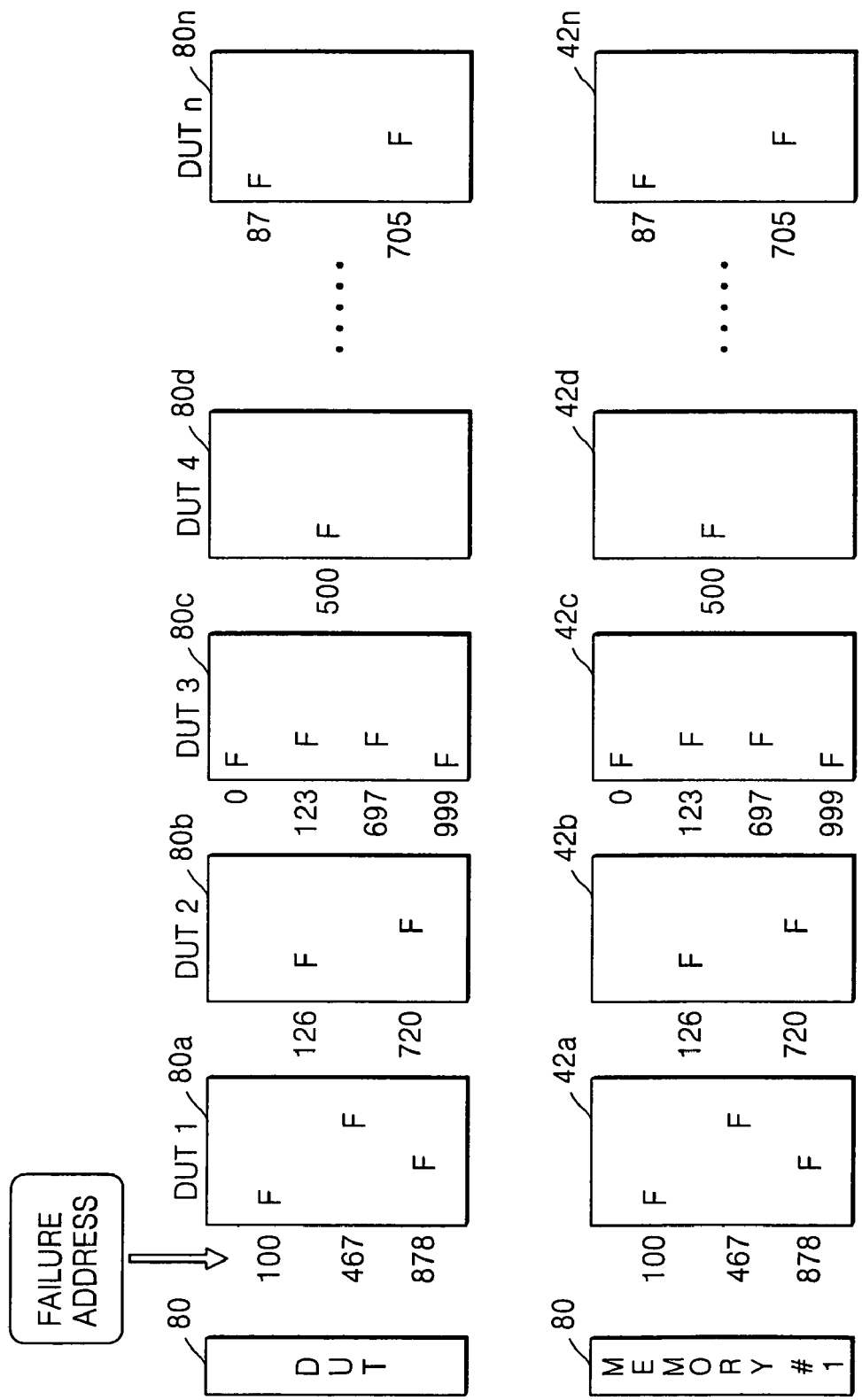
FIG. 2 is a block diagram showing the mapping of states of the memories of DUTs to a first memory of the tester during the electrical test of the flash memory device executed in the conventional tester.
Figure 3:
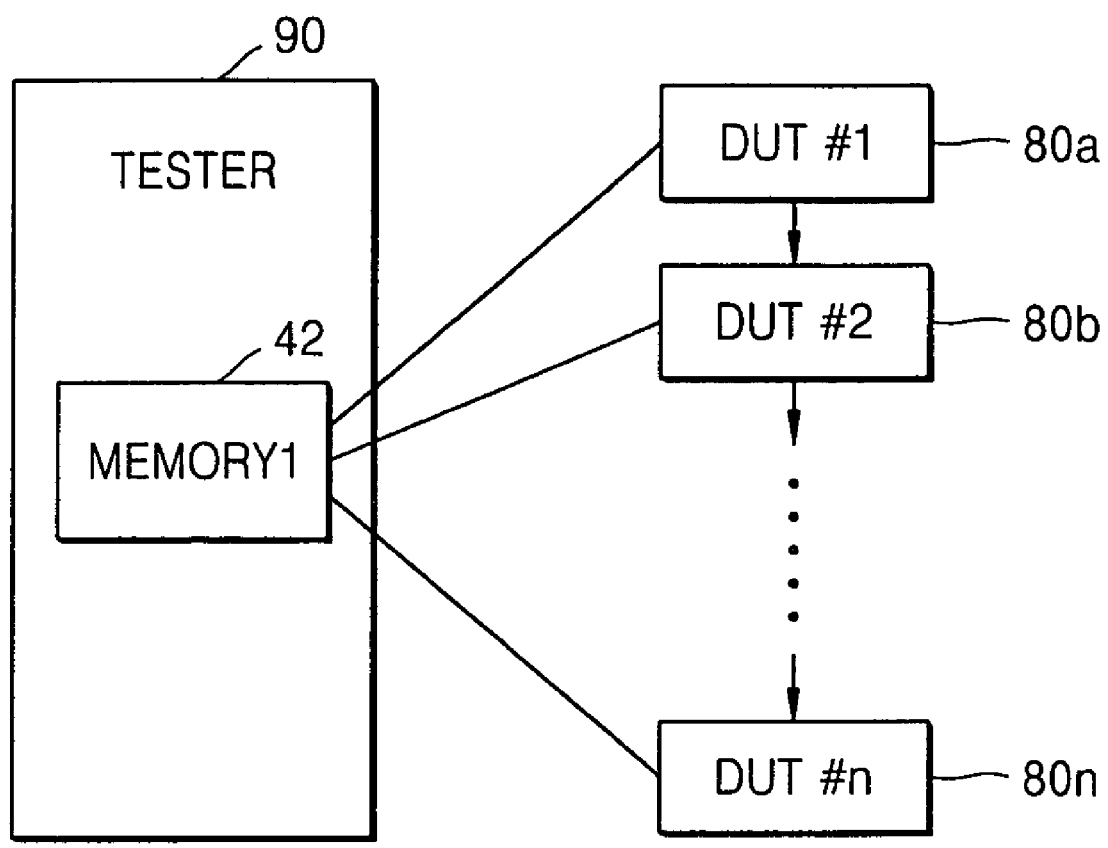
FIG. 3 is a block diagram illustrating a method of electrically testing the flash memory device by a conventional technique.
Figure 4:
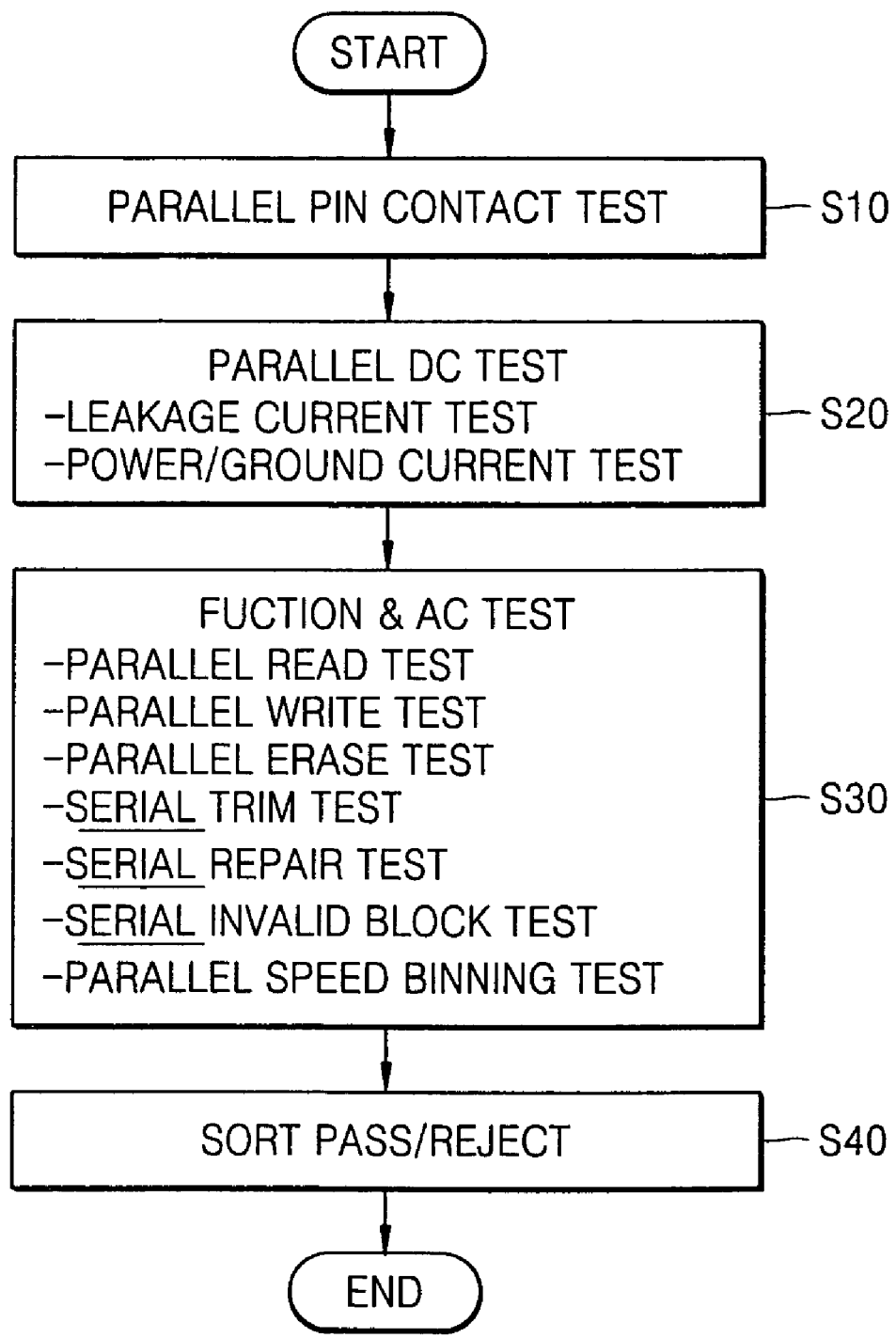
FIG. 4 is a test flowchart illustrating a conventional method of electrically testing a flash memory device.
Figure 5:
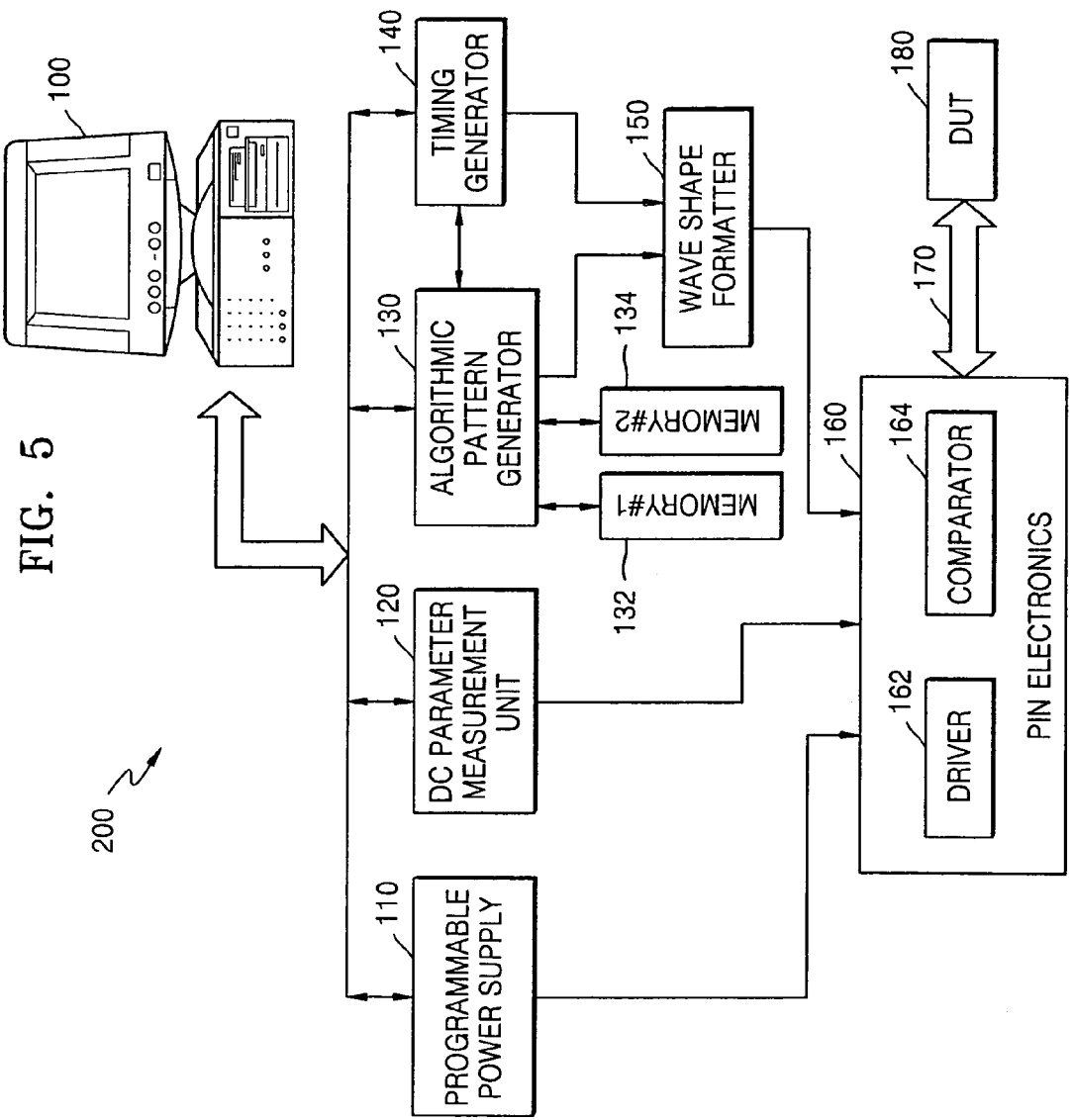
FIG. 5 is a schematic block diagram of a tester that electrically tests a semiconductor memory device according to an embodiment of the present invention.

FIG. 5 is a schematic block diagram of a first embodiment of the invention. FIG. 5 shows a tester that electrically tests semiconductor memory devices in accordance with the present invention.

The flash memory tester 200 shown in FIG. 5 includes a test processor 100 and a programmable power supply 110. The programmable power supply 110 is connected to and controlled by the test processor 100. A DC parameter measurement unit 120 is connected to and controlled by the test processor 100. Also, an algorithmic pattern generator 130 is connected to and controlled by the test processor 100. The algorithmic pattern generator 130 has a first memory 132, which stores failure information during a function test and a second memory 134 capable of storing failure address information corresponding to the information stored in the first memory 132. The memories 132 and 134 are capable of supplying different data to identical addresses in each of the DUTs when the DUTs are subjected to the parallel test.

A timing generator 140 and pin electronics 160 are connected to and controlled by the test processor 100. Pin electronics 160 includes a driver 162 and a comparator 164. A wave shape formatter 150 is provided for processing information supplied from the algorithmic pattern generator 130 and a timing generator 140. Wave shape formatter 150 supplies processed data to the pin electronics 160.

The test processor 100 is a computer that controls the overall operation of the tester. The programmable power supply 110 generates electric power required for electrically testing the DUTs 180. The DC parameter measurement unit 120 generates a reference voltage Voh/Vil and reference current Ioh/Iol, which are required when electrically testing the DUTs 180. The leakage current characteristic associated with the reference voltage Voh/Vil and reference current Ioh/Iol are measured.

The algorithmic pattern generator 130 varies data, address format and the order of the data/address in response to a specific algorithm under the control of the test processor 100. The first memory 132 is referred to as a FAM (Fail Analysis Memory) or ECR (Error Catch FAM). It stores failure information generated from a specific DUTs 180 during testing in parallel. The first memory 132 is mapped with the memory state of the DUT 180 in the ratio of 1:1. Accordingly, the failure information of the DUT 180 is randomly stored and then is utilized as expect data in read operation/write operation.

The second memory 134 separately stores information relating to failure addresses corresponding to the failure information of the first memory 132. It supplies the stored information to the DUT 180 when performing function tests of specific items, e.g., the trim test, the repair test and the invalid block making test. Preferably, the second memory 134 is an SRAM having a high operating speed, and a capacity that is smaller than that of the first memory 132. As one example, if the capacity of the first memory may be 132 1 giga, the second memory 134 may be an SRAM of 1 mega or smaller. The SRAM may be ASICs.

The timing generator 140 and wave shape formatter 150 together with the algorithmic pattern generator 130 generate a timing waveform and set a phase required for the electrical test used for testing the AC characteristic of the DUT 180. The pin electronics 160 is electrically interfaced with the DUT 180. The interface 170 is a handler when the DUT 180 is a semiconductor package and it is a probe station when the DUT 180 is a wafer.

Figure 6:
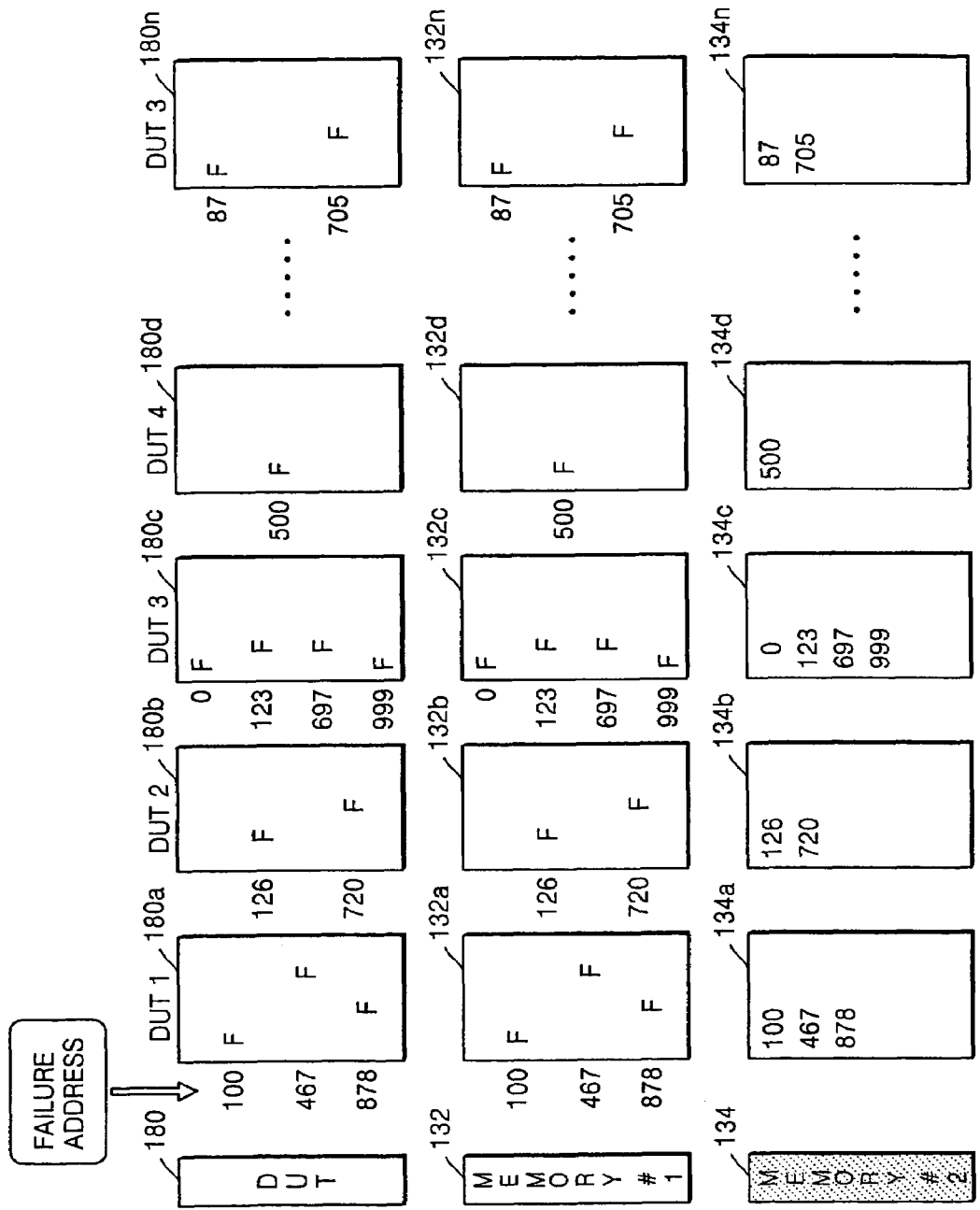
FIG. 6 is a block diagram illustrating mapping states of a memory of a DUT in first and second memories of the tester during an electrical test.

FIG. 6 is a block diagram showing the mapping of the memory of the DUT and the first and second memories of the tester. Referring to FIG. 6, the first memory 132 and the second memory 134 contain the same number of memories as the number of parallel-tested DUTs 180. The mapping state of the first memory 132 corresponds to the DUT 180 on a one-to-one basis and they have the same capacity. The second memory 134 reads out the failure information from the first memory 132 to sequentially store the failure addresses, for example, 100, 467 and 878 in a first DUT 180a. Therefore, the capacity of the second memory 134 may be smaller than the first memory 132.

Figure 7:
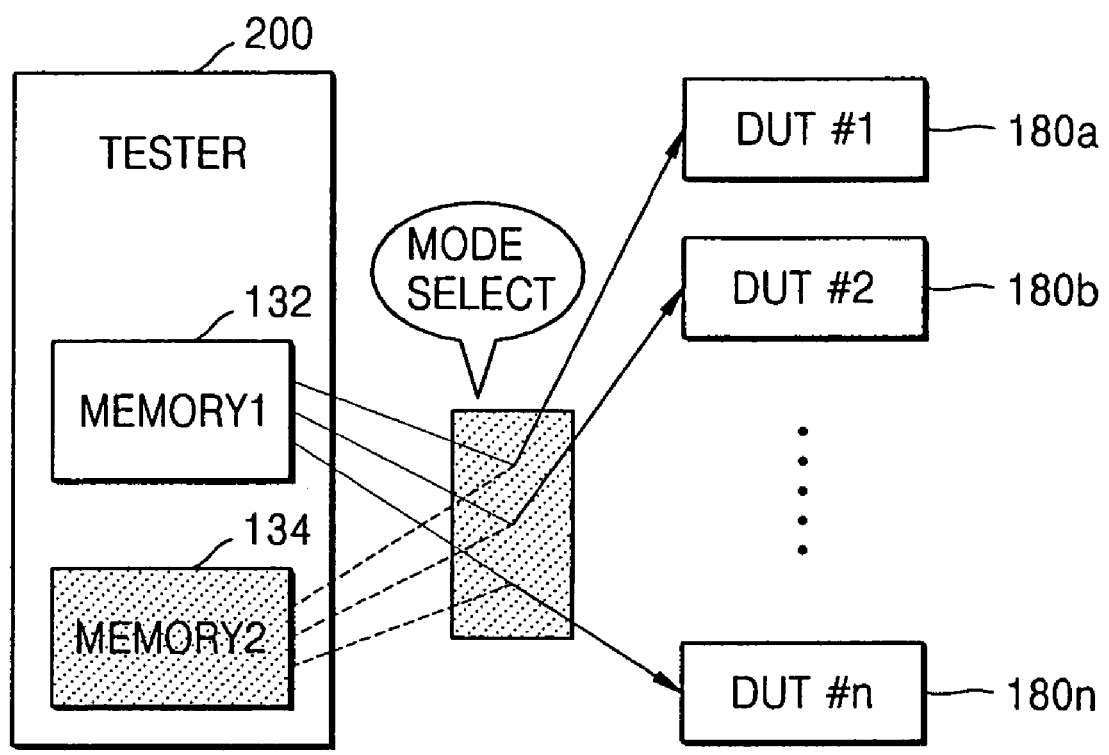
FIG. 7 is a block diagram illustrating a method of electrically testing flash memory device according to another embodiment of the present invention.
Figure 8:
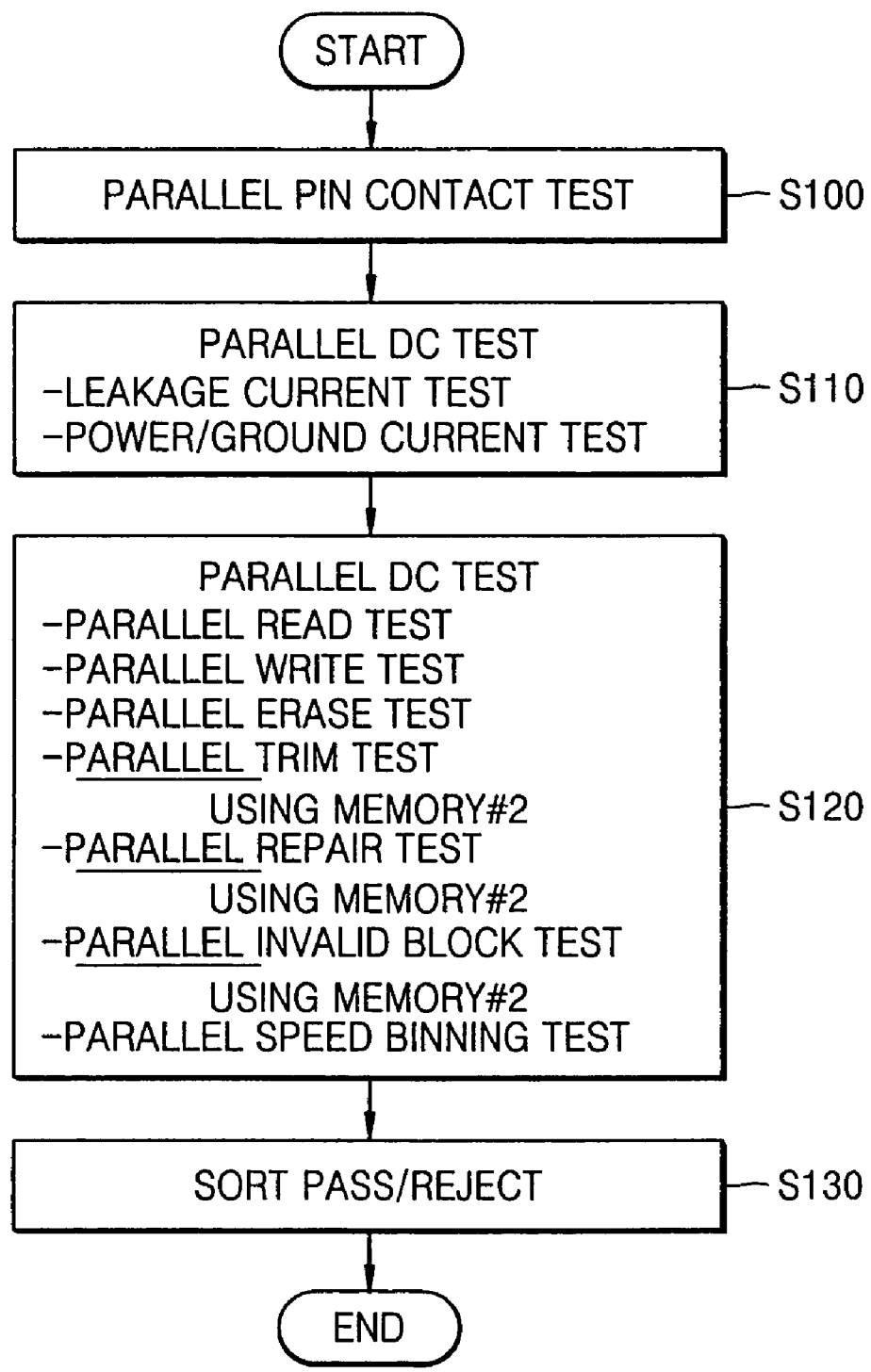
FIG. 8 is a test flowchart illustrating the method of electrically testing flash memory device according to yet another embodiment of the present invention.

Referring to FIGS. 7 and 8, the electrical testing is performed in the order of a pin contact test (S100), a DC characteristics test (S110), a function test & AC characteristics test (S120), and pass/reject sorting (S130). All items are tested by the parallel system, thereby offering high throughput when the number of DUTs is in the order of 256.

The electrical tests include a test in which a failure address is used for the electrical function test. Such tests are conducted by a serial test system in conventional methods and they include the trim test, the repair test, and the invalid block masking test, etc.

The trim test belongs to an Electrical Die Sorting (EDS) test, in which the voltage condition that allows for pass (good products) slightly varies in respective DUTs during the programming and erasing operations in a flash memory. More specifically, since the characteristics slightly vary from one DUT to the next, the trim test is executed to adjust the deviation by a mean value.

It is very difficult for all memory cells in a large memory to pass, thus, a redundancy memory of small capacities is formed when designing a semiconductor memory device. This memory is used to replace rejected memory cells with redundancy memory cells, thereby lowering a rejection rate. A test for replacing the rejected memory with the redundancy memory is the repair test. Laser cutting or electrical fuse cutting is used to execute the replacement in such a manner that an address of the rejected memory corresponds to an address of the redundancy memory.

In the invalid block masking test, the memory is given a pass even if a memory cell or block has a defect if the defect is smaller than an allowable range designated by the maker. An invalid block masking test is performed, in which a defective memory cell or block is marked differently from good memory cells or blocks, so that a user can identify the defect. Generally, with respect to NAND flash memory devices, 1 is written to good memory cells or blocks while 0 is written to rejected memory cells or blocks.

According to an aspect of the present invention, the first and second memories 132 and 134 are utilized during testing specific items that use failure addresses, e.g., the trim test, the repair test and the invalid block masking test. The second memory supplies different data to respective DUTs 180a, 180b, 180c, 180d, . . . , and 180n from the same address of the tester via a mode selection. Consequently, the function test of specific items that are conventionally carried out in serial, e.g., the trim test, the repair test and the invalid block masking test, can be simultaneously performed in parallel, thus remarkably shortening the test time.

The reason that a parallel test can be done with respect to the DUT 180 is that the DUT 180 is a flash memory, i.e., a mux memory. Mux memories such as NAND flash memories and NOR flash memories have an address pin and an input/output pin (I/O pin). If the address can be designated by the I/O pin, the present invention can be used.

In view of the aforementioned, the first and second memories 132 and 134 cannot be simultaneously connected to the I/O pin of the tester since the capability of the I/O pin within the tester is restricted. Accordingly, the first memory 132 and the second memory 134 are simultaneously connected by means of the single I/O pin in the tester, so that either one of the first memory 132 or the second memory 134 is selected to gain required information, as necessary.

As a result, according to an aspect of the present invention, tests that are conventionally serially conducted during the flash memory test can be tested by a parallel system, thereby remarkably decreasing the electrical test time. For example, it is assumed that the number of DUTs being tested in parallel is 256, and an average number of failed DUTs, which has to be subjected to the serial test is 5 (minimally 0 and maximally 10). Then, if the time taken for performing the serial test once is assumed to be 50 ms, the time elapsed for executing the serial test is obtained by the equation that 50 ms*5 times*256=64 seconds. Whereas, when the test items are performed by the parallel test, the test time is decreased by roughly 94% by the equation that 3.5 seconds+ (50 ms*10 times)=4 seconds, providing that time for simultaneously transmitting data to 256 DUTs. This effect becomes further maximized as the flash memory device has higher packing density and, in turn, involves a higher probability of failure.

It is noted that according to an aspect of the present invention, there is provided a flash memory test system capable of test time reduction. The system includes a test processor capable of testing a semiconductor memory device, a programmable power supply and a direct current (DC) parameter measurement unit. The programmable power supply and the direct current (DC) parameter measurement unit are connected to and controlled by the test processor. An algorithmic pattern generator is also connected to and controlled by the test processor. The algorithmic pattern generator includes a first memory that stores failure information during a function test, and a second memory that stores failure address information corresponding to the failure information of the first memory. The memories supply different data to identical addresses in each of a plurality of Devices Under Test (DUTs) during a parallel test of a specific item. A timing generator is connected to and controlled by the test processor Pin electronics connected to and controlled by the test processor include a driver and a comparator. Furthermore, a wave shape formatter processes information supplied from the algorithmic pattern generator and the timing generator, and supplies the processed information to the pin electronics.

It is also noted that according to another aspect of the present invention, there is provided a method of testing a flash memory device in which a first step conducts a function test of a semiconductor memory device by a parallel test system, a second step stores failure information in a corresponding address of a first memory within a tester when failure is found in a DUT and in a third step, the first memory is searched to thereby store failure address information in a second memory within the tester. A fourth step is carried out by conducting a parallel test which by supplies different data to identical addresses of the DUTs, using the information stored in the first and second memories.

Finally it is noted that in one preferred embodiment of the present invention, the second memory is a Static Random Access Memory (SRAM) with a high operating speed. Preferably, the function test of the specific items can be a trim test, a repair test, and an invalid block masking test. The DUT is a mux memory capable of designating the address by an I/O pin within the tester, can be either a NOR flash memory or a NAND flash memory.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A flash memory test system comprising:
    a test processor to control tests of semiconductor memory devices;
    a programmable power supply connected to and controlled by said test processor;
    a direct current (DC) parameter measurement unit connected to and controlled by said test processor;
    an algorithmic pattern generator connected to and controlled by said test processor, said algorithmic pattern generator having a first memory that stores failure information and a second memory that stores failure address information corresponding to the failure information of the first memory, whereby different data can be supplied to identical addresses in each of a plurality of Devices Under Test (DUTs) during a parallel test of a specific item;
    a timing generator connected to and controlled by said test processor;
    pin electronics connected to and controlled by said test processor, and internally having a driver and a comparator; and
    a wave shape formatter that processes information supplied from the algorithmic pattern generator and the timing generator, and supplies the processed information to the pin electronics.

2. The flash memory test system as claimed in claim 1, wherein the second memory comprises a Static Random Access Memory (SRAM) with a high operating speed.

3. The flash memory test system as claimed in claim 1, wherein the second memory has a capacity smaller than that of the first memory.

4. The flash memory test system as claimed in claim 1, wherein the second memory is one of a plurality of failure address memories to store failure address information, and the number of failure address memories is equal to the number of the DUTs.

5. The flash memory test system claimed in claim 1, wherein the parallel test of the specific item is one selected from the following: a trim test, a repair test, and an invalid block masking test.

6. The flash memory test system as claimed in claim 1, wherein the first and second memories are coupled to the plurality of DUTs through a mode selection unit.

7. A method of reducing the test time of flash memory devices comprising:
   conducting a function test of a semiconductor memory device by a parallel test system;
   storing failure information in a particular address of a first memory, said address corresponding to the address of the failure in the DUT;
   searching the first memory and storing failure address information in a second memory within the tester; and
   conducting the parallel test by supplying respectively different data to identical addresses of the DUTs, using the information stored in the first and second memories during the function test of a specific item.

8. The method of testing flash memory devices as claimed in claim 7, wherein the function test of the specific item is one of the following: a trim test, a repair test, and an invalid block masking test.

9. The method of testing the flash memory devices, as claimed in claim 7, wherein the failure address of the DUT corresponds to the equivalent storage address of the first memory in the ratio of 1:1.

10. The method of testing the flash memory devices as claimed in claim 7, wherein the DUT comprises a mux memory addressed by an I/O pin within the tester.

11. The method of testing the flash memory devices as claimed in claim 10, wherein the mux memory is one of a NOR flash memory and a NAND flash memory.

12. A method of testing flash memory devices utilizing an algorithmic pattern generator that includes a first memory and a second memory, said method comprising:
   testing a plurality of DUTs by a parallel test system;
   storing failure information in a particular address of the first memory of the tester once a failure is found in the DUT during a parallel function test, said particular address corresponding to the address of the failure in the DUT;
   searching the failure information of the first memory, and storing the information of the failure address in the second memory; and
   conducting the parallel test that supplies different data to the identical addresses of a plurality of DUTs, using the data stored in the first and second memories.

13. The method of testing flash memory devices as claimed in claim 12, wherein the second memory comprises a Static Random Access Memory (SRAM) with a high operating speed.

14. The method of testing flash memory devices as claimed in claim 12, wherein the second memory has a capacity smaller than that of the first memory.

15. The method of testing flash memory devices as claimed in claim 12, wherein the second memory is one of a plurality of failure address memories to store failure address information, and the number of failure address memories is equal to the number of the DUTs.

16. The method of testing flash memory devices as claimed in claim 12, wherein the DUT comprises a mux memory capable of being addressed by an I/O pin within the tester.

17. The method of testing flash memory devices as claimed in claim 16, wherein the mux memory is one of a NOR flash memory and a NAND flash memory.

18. The method of testing flash memory devices as claimed in claim 12, wherein an equivalent address of the first memory in the tester corresponds to the failure address of the DUT in the ratio of 1:1.

19. The method of testing flash memory device as claimed in claim 12, wherein the function test of the specific item is any one of a trim test, a repair test, and an invalid block masking test.

* * * * *

UNITED STATES PATENT AND TRADEMARK OFFICE
CERTIFICATE OF CORRECTION

PATENT NO. : 7,254,757 B2  
APPLICATION NO. : 10/954834  
DATED : August 7, 2007  
INVENTOR(S) : Dong-Kyoo Park et al.

It is certified that error appears in the above-identified patent and that said Letters Patent is hereby corrected as shown below:

Column 2, line 29, the words "SI 0" should read -- S10 --;  
Column 4, line 1, the words "Voh/Vil" should read -- Voh/Vi1 --;  
Column 4, line 2, the words "Ioh/Iol" should read -- Ioh/Io1 --;  
Column 4, line 4, the words "Voh/Vil" should read -- Voh/Vi1 --;  
Column 4, line 5, the words "Ioh/Iol" should read -- Ioh/Io1 --.

Signed and Sealed this

Second Day of September, 2008

JON W. DUDAS  
*Director of the United States Patent and Trademark Office*